(12) United States Patent
Jang

(10) Patent No.: US 7,732,316 B2
(45) Date of Patent: Jun. 8, 2010

(54) METHOD FOR MANUFACTURING A SEMICONDUCTOR DEVICE

(75) Inventor: Chi Hwan Jang, Icheon-si (KR)

(73) Assignee: Hynix Semiconductor Inc. (KR)

( * ) Notice: Subject to any disclaimer, the term of this patent is extended or adjusted under 35 U.S.C. 154(b) by 24 days.

(21) Appl. No.: 12/344,992

(22) Filed: Dec. 29, 2008

(65) Prior Publication Data

US 2010/0062594 A1    Mar. 11, 2010

(30) Foreign Application Priority Data

Sep. 5, 2008  (KR)  ...................... 10-2008-0087844

(51) Int. Cl.
*H01L 21/3205* (2006.01)

(52) U.S. Cl. .............................. 438/587; 257/E21.013; 257/E23.165; 257/E51.04

(58) Field of Classification Search ................. 438/164, 438/482, 585, 587; 257/E21.013, E23.074, 257/E23.165, E51.04
See application file for complete search history.

(56) References Cited

U.S. PATENT DOCUMENTS 7,524,718 B2 *  4/2009  Furusawa et al. ........... 438/202

* cited by examiner

*Primary Examiner*—Quoc D Hoang
(74) *Attorney, Agent, or Firm*—Marshall, Gerstein & Borun LLP

(57) ABSTRACT

In accordance with an embodiment of the invention the method of manufacturing a semiconductor device is capable of forming a semiconductor substrate having an embossing structure. The method includes forming a layer having a plurality of hemispherical single crystal silicon elements, and forming one or more carbon nano tubes between adjacent hemispherical single crystal silicon elements, thereby, increasing a length of an effective channel of a transistor.

16 Claims, 6 Drawing Sheets

METHOD FOR MANUFACTURING A SEMICONDUCTOR DEVICE

CROSS-REFERENCE TO RELATED APPLICATION

Priority to Korean patent application number 10-2008-0087844, filed on Sep. 5, 2008, the disclosure of which is incorporated herein by reference in its entirety, is claimed.

BACKGROUND OF THE INVENTION

The invention relates to a method of manufacturing a semiconductor device. Recently, as a design rule of a semiconductor device has been rapidly reduced to less than a 100 nm class, correspondingly, the length and width of channel of a transistor is decreased. Additionally, the concentration of doping to a junction area is increased such that a junction leakage current according to an increment of electric field is increased. Thus, in a transistor structure having a conventional planer channel structure, it is difficult to obtain a desired threshold voltage Vt in a highly integrated device, while reaching uppermost limit in improving a refresh characteristic. Accordingly, implementation of a semiconductor device having various forms of recess channels capable of securing an effective channel length of a transistor and the implementation of a semiconductor device having a three-dimensional channel structure capable of extending a channel width and practical process development researches are actively progressing. However, in the process of implementing the semiconductor device having three-dimensional structure channel, a fault frequently happens.

BRIEF SUMMARY OF THE INVENTION

Various embodiments of the invention are directed to providing a manufacturing method of a semiconductor device.

According to an embodiment of the invention, a method of manufacturing a semiconductor device includes forming a layer having a plurality of hemispherical single crystal silicon elements over a semiconductor substrate; forming one or more carbon nano tubes between adjacent hemispherical single crystal silicon elements; forming a gate insulating layer on a surface of the plurality of hemispherical single crystal silicon elements, the semiconductor substrate, and the carbon nano tubes; and forming a gate material layer over the gate insulating layer.

Preferably, the layer having a plurality of hemispherical single crystal silicon elements is formed by forming a photoresist pattern, which exposes an active region, on an upper portion of the semiconductor substrate; forming a layer having a plurality of hemispherical polycrystalline silicon elements over the active region; transforming the hemispherical polycrystalline silicon elements into the hemispherical single crystal silicon elements; and removing the photoresist pattern. In accordance with an embodiment of the invention, it is preferable that the layer having a plurality of hemispherical polycrystalline silicon elements is formed with a material selected from the group consisting of a metastable polysilicon layer and a hemispherical silicon crystalline layer, and combinations thereof.

Preferably, transforming the hemispherical polycrystalline silicon elements into the hemispherical single crystal silicon elements includes performing a thermal process. The thermal process can be selected from the group consisting of a rapid thermal annealing process and a furnace annealing process. The thermal process is performed in a temperature in a range of about 600° C. to about 1000° C. The rapid thermal annealing process is performed for a time in a range of one to thirty minutes. The furnace annealing process is performed for a time in a range of twenty minutes to two hours.

Preferably, transforming the hemispherical polycrystalline silicon elements into hemispherical single crystal silicon elements is performed using plasma. Preferably, transforming the hemispherical polycrystalline silicon elements includes performing an ion injection process using an inert gas. Preferably, an acceleration energy of the ion injection process ranges from 1 KeV to 10 KeV.

Preferably, the carbon nano tubes are formed using a surface energy difference of the hemispherical single crystal silicon elements. Preferably, the carbon nano tubes are formed in an atmosphere of a mixed gas of hydrogen and carbon. Preferably, a height of the carbon nano tubes ranges from 10 nm to 200 nm. Preferably, the gate insulating layer is formed by an atomic layer deposition method. The gate insulating layer can be formed, for example, with a material selected from the group consisting of $Al_2O_3$, $HfO_2$, $ZrO_2$, $SiON$, $La_2O_3$, $Y_2O_3$, $TiO_2$, $CeO_2$, $N_2O_3$, $Ta_2O_5$, $BaTiO_3$, $SrTiO_3$, BST, PZT, and combinations thereof.

DESCRIPTION OF EMBODIMENTS

Hereinafter, an embodiment of the invention will be illustrated in detail with reference to the attached drawings.

FIGS. 1a to 1j are a cross-sectional view showing a manufacturing method of a semiconductor device according to an embodiment of the invention.

Figure 1A:
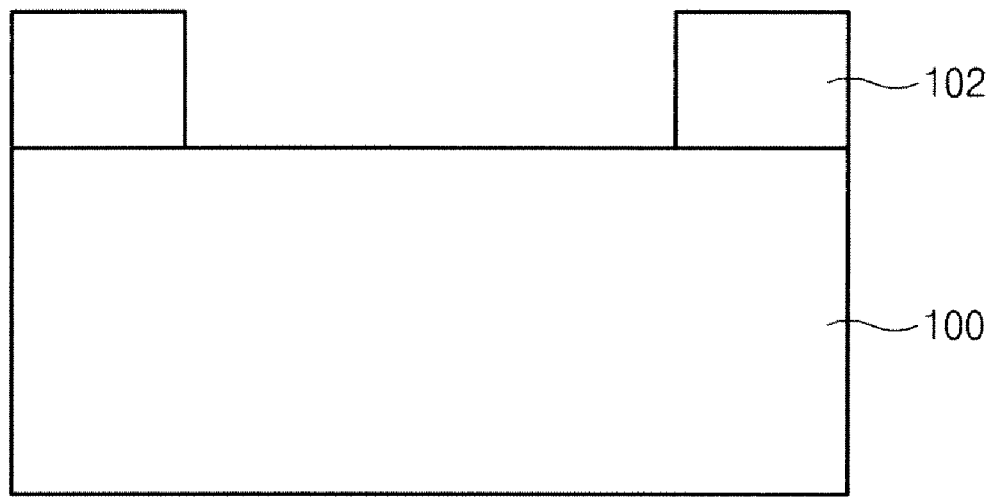
FIGS. 1a to 1j are a cross-sectional view showing a manufacturing method of a semiconductor device according to an embodiment of the invention.

Referring to FIG. 1a, an isolation film (not shown) which defines an active region on a semiconductor substrate 100 is formed. Then, a photoresist pattern 102 which exposes the active region over the semiconductor substrate 100 is formed. The active region can include, for example, the region in which a gate is formed.

Figure 1B:
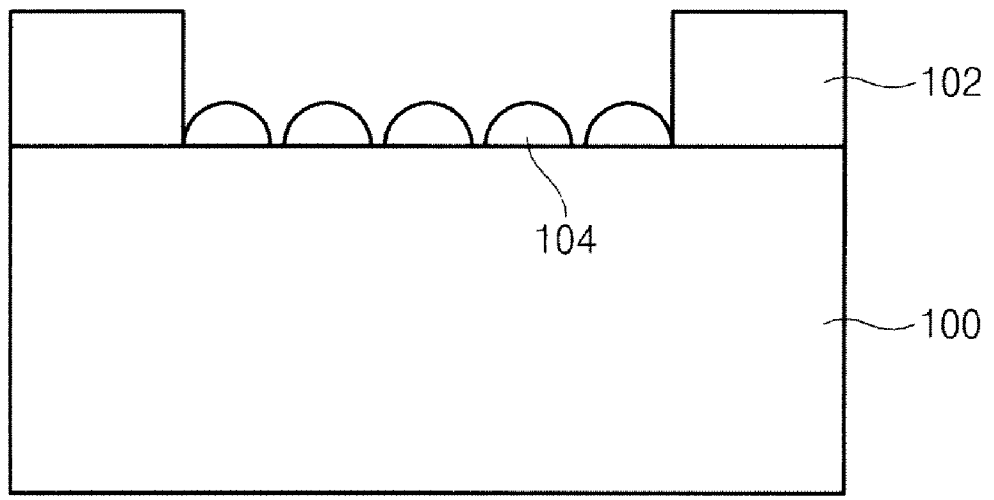

Referring to FIG. 1b, a layer having a plurality of hemispherical polycrystalline silicon elements 104 is formed over the portion of the semiconductor substrate 100 exposed by the photoresist pattern 102. Preferably the layer having the plurality of hemispherical polycrystalline silicon elements 104 is formed with a material selected from the group consisting a metastable polysilicon layer (MPS), a hemispherical silicon grain layer (HSG), and combinations thereof. After depositing an amorphous silicon layer, if the MPS performs a Si atomic migration by using a thermal process, the amorphous silicon is visualized, and transformed into poly-crystalline silicon.

A gap between adjacent hemispherical polycrystalline silicon elements 104 can be controlled according to the length and number of linear directions of the polycrystalline silicon elements 104. FIG. 1b of the invention exemplifies the case where the polycrystalline silicon elements 104 are separated by a gap. However, adjacent hemispherical polycrystalline silicon elements 104 can also be in contact with each other.

Figure 1C:
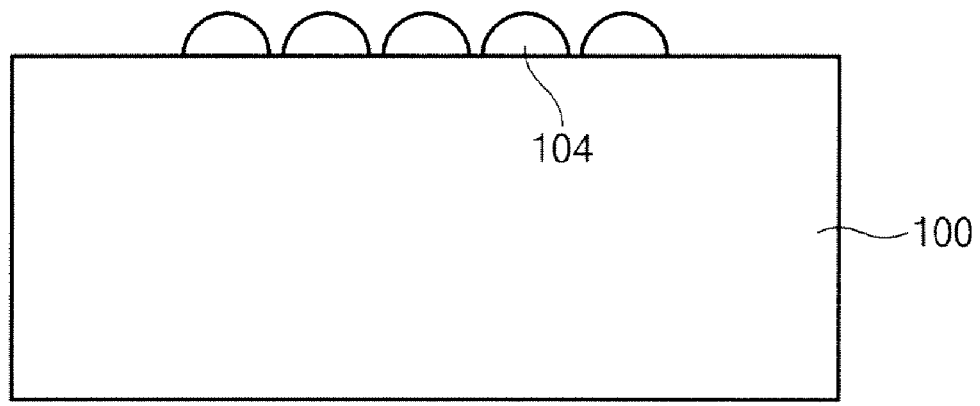
Figure 1D:
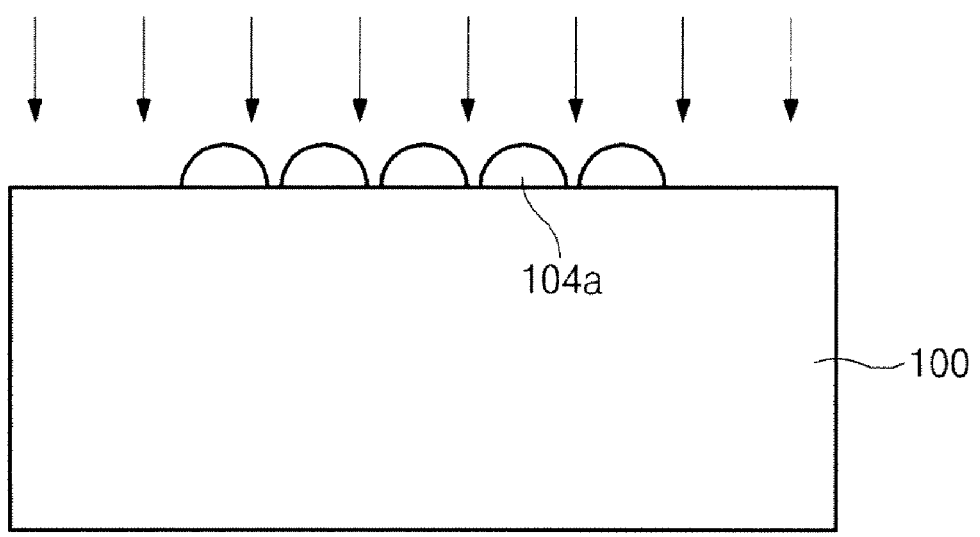

Referring to FIGS. 1c and 1d, the photoresist pattern 102 is removed. So that the hemispherical polycrystalline silicon elements 104 have the same architectural features as the semiconductor substrate 100, the hemispherical polycrystalline silicon elements 104 are transformed into hemispherical single crystal silicon elements 104a. The semiconductor substrate 100 locally having an embossing structure can be used to increase the surface area of the active region.

A thermal process can be performed to transform the hemispherical polycrystalline silicon elements 104 into the hemispherical single crystal silicon elements 104a. Preferably, the thermal process is a rapid thermal annealing (RTA) process or a furnace annealing process. It is preferable that the thermal process is performed in a temperature range of about 600° C. to about 1000° C.

Preferably, the rapid thermal annealing process is performed for about one minute to about thirty minutes. The rapid thermal annealing process can be performed, for example, using a halogen lamp. Preferably, the furnace annealing process is performed for about twenty minutes to about two hours. The furnace annealing process can be performed, for example, using a tungsten coil. Energy can be supplied to the hemispherical single crystal silicon elements 104a using plasma instead of the thermal process.

Moreover, an ion injection process can be used to supply energy to the hemispherical single crystal silicon elements 104a. The energy supplied to the hemispherical polycrystalline silicon elements 104 through the ion injection process, using, for example, an inert gas, can transform the hemispherical polycrystalline silicon elements 104 into the hemispherical single crystal silicon elements 104a. Preferably, the acceleration energy in the ion injection process ranges from about 1 KeV to about 10 KeV.

Figure 1E:
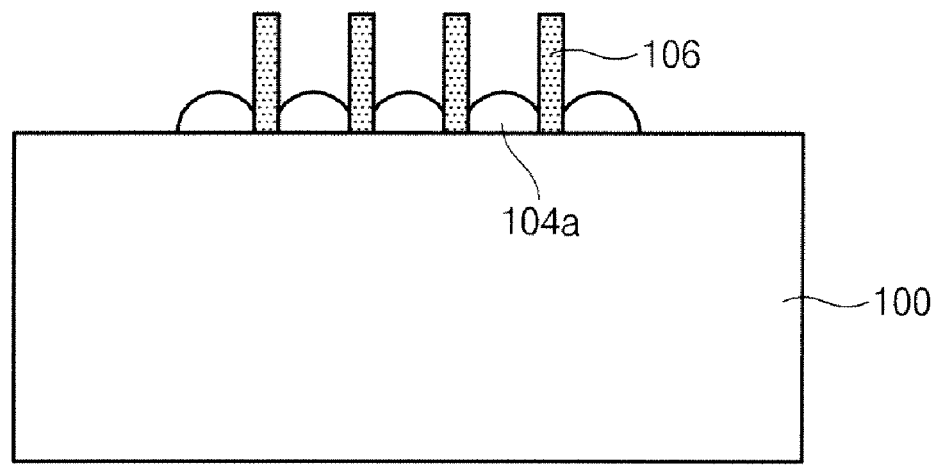

Referring to FIG. 1e, one or more carbon nano tubes (CNTs) 106 are formed over the semiconductor substrate 100, between adjacent hemispherical single crystal silicon elements 104a. Preferably, the CNT 106 formation process is performed in a mixed gas atmosphere of hydrogen and carbon. Preferably, the height of the CNTs 106 ranges from about 10 nm to about 200 nm. The number of CNTs formed can be controlled by the concentration of the hemispherical single crystal silicon elements 104a.

Figure 2:
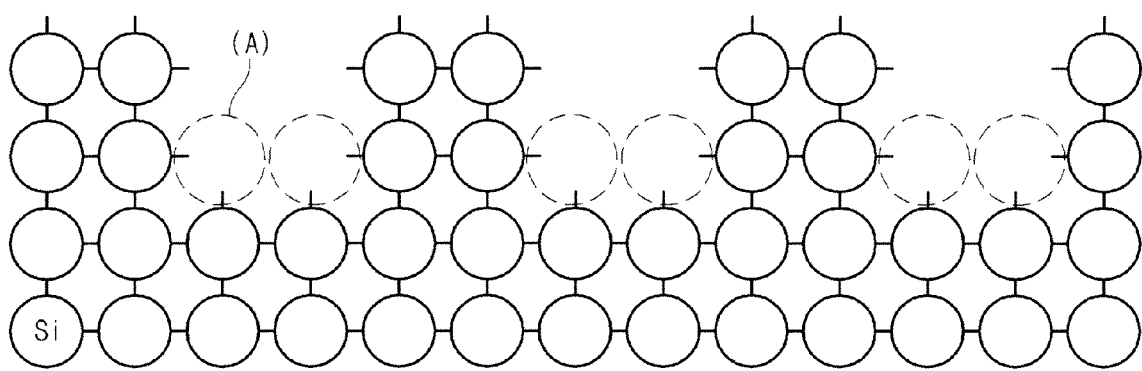
FIG. 2 is a cross-sectional view of the layer having a plurality of hemispherical single crystal silicon elements illustrated in FIG. 1d.

The CNTs 106 can be formed using the surface energy difference resulting from the hemispherical shape of the hemispherical single crystal silicon elements 104a. Specifically, with reference to a cross-sectional view of the hemispherical single crystal silicon elements 104a illustrated in FIG. 2, a portion in which unpaired electrons of a silicon (Si) does not unite with another silicon (Si) exists. That is, a site A is a portion that can unite with another atom and has relatively large surface energy in comparison with other sites.

A high surface energy exists between adjacent hemispherical single crystal silicon elements 104a. Therefore, a carbon nano tube 106 can be grown up between adjacent hemispherical single crystal silicon elements 104a, where there is relatively high surface energy.

Generally, whereas the CNTs 106 are conventionally formed with a metal layer as a seed layer, the invention uses the hemispherical shape of the hemispherical single crystal silicon elements 104a thereby, being able to omit an additional metal layer forming process, which can simplify the process. In the embodiment of the invention, it is exemplified that the CNTs 106 are grown between adjacent hemispherical single crystal silicon elements 104a. However, the CNTs can be formed by other materials having a lower resistance than the hemispherical single crystal silicon elements 104a.

Figure 1F:
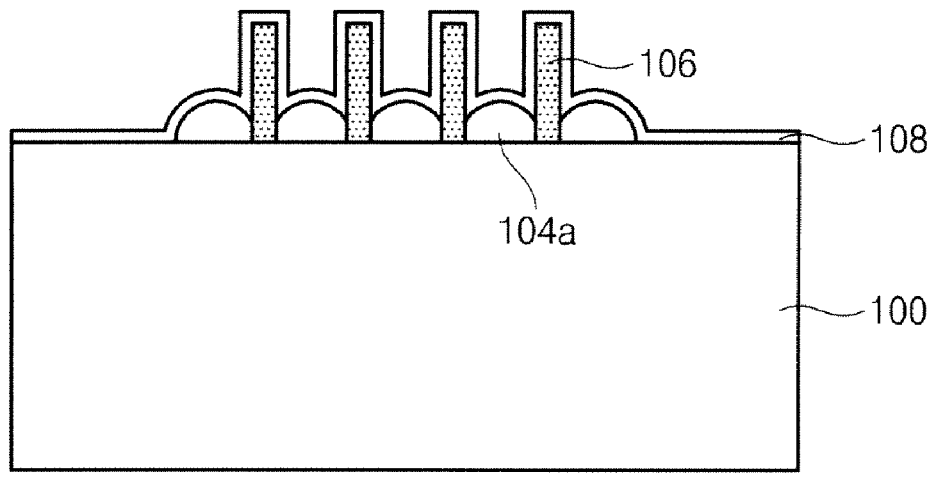

Referring to FIG. 1f, a gate insulating layer 108 is formed over the semiconductor substrate 100, the hemispherical single crystal silicon elements 104a, and the CNTs 106. Preferably, the gate insulating layer 108 is formed by an atomic layer deposition ALD method.

The gate insulating layer 108 can be formed, for example, with a high dielectric material having a high dielectric constant (high-k), such as, a material selected from the group consisting of $Al_2O_3$, $HfO_2$, $ZrO_2$, $SiON$, $La_2O_3$, $Y_2O_3$, $TiO_2$, $CeO_2$, $N_2O_3$, $Ta_2O_5$, $BaTiO_3$, $SrTiO_3$, (BST) and PbZrTiO (PZT).

Figure 1G:
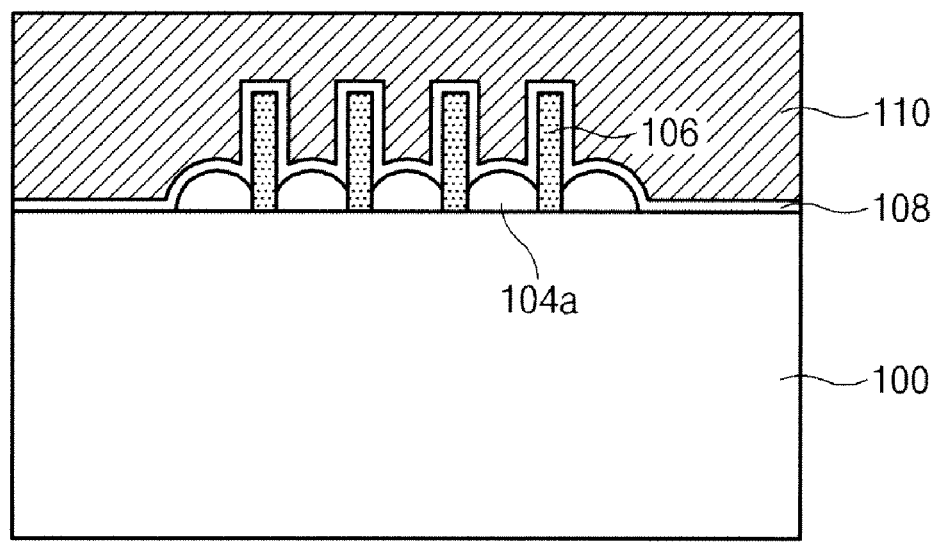
Figure 1H:
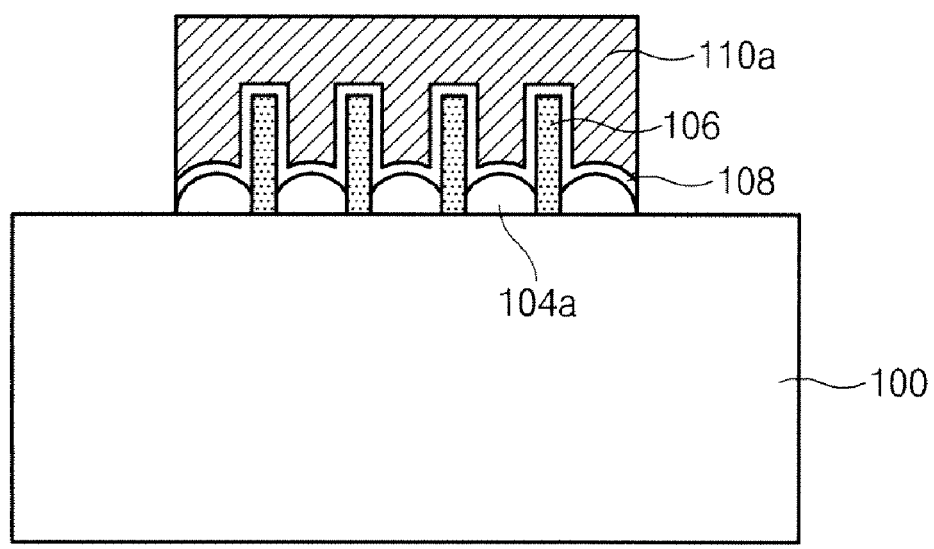
Figure 1I:
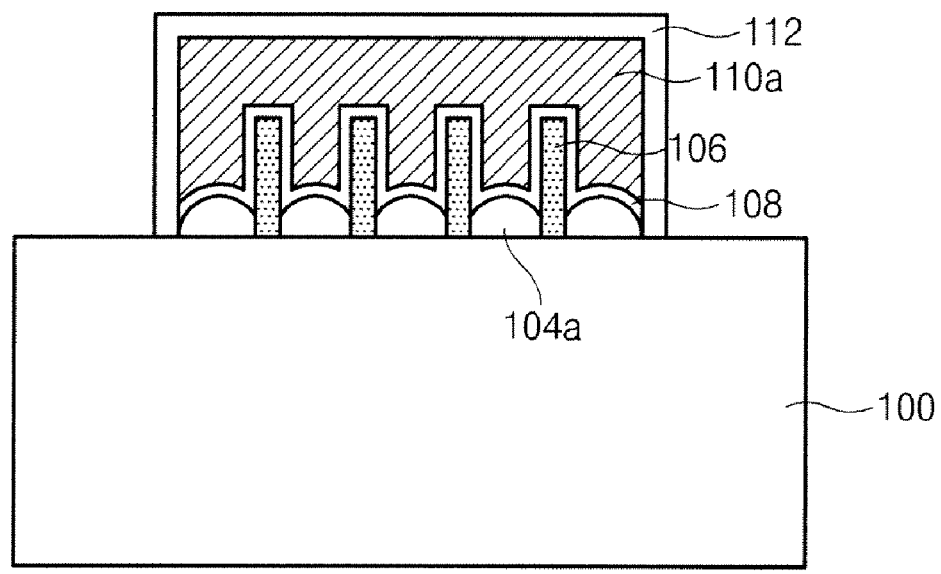

Referring to FIGS. 1g to 1i, a gate electrode layer 110 is formed over the gate insulating layer 108. The gate electrode layer 110 is etched by a photolithographic etching process using a gate mask (not shown) to form a gate electrode layer pattern 110a. A material layer for spacer 112 is formed over the semiconductor substrate 100 including the gate electrode layer pattern 110a.

Figure 1J:
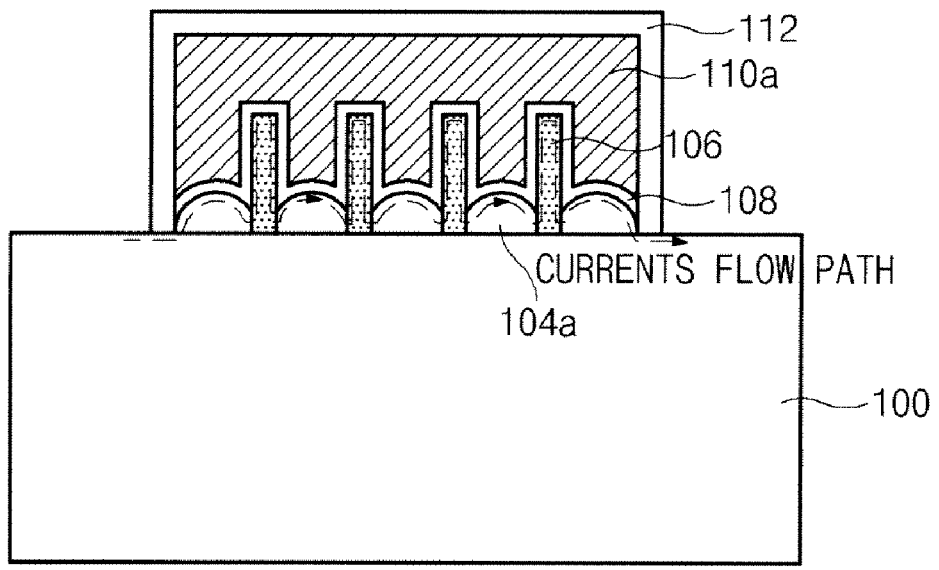

As shown in FIG. 1j, the invention forms the semiconductor substrate 100 having an embossing structure by forming a layer having hemispherical single crystal silicon elements 104a. The CNTs 106 are grown between adjacent hemispherical single crystal silicon elements 104a such that currents flow through the hemispherical single crystal silicon elements 104a and the CNTs 106 during transistor operation.

The resistance of the CNTs 106 is lower than that of the hemispherical single crystal silicon elements 104a. Therefore, a current does not flow toward the hemispherical single crystal silicon elements 104a but flows in the CNTs 106.

Therefore, instead of forming the transistor of three dimensional structure by etching the semiconductor substrate, a three dimensional channel can be built up using the hemispherical single crystal silicon elements 104a and the CNTs 106 in a planar structure, such that an effective channel length can be easily increased.

Moreover, the CNTs 106 are formed by using the surface energy of the hemispherical single crystal silicon elements 104a without a seed layer, such as a metal layer, thereby the process can be simplified. Moreover, the number and length of the hemispherical single crystal silicon elements 104a and CNTs 106 can be controlled to increase a effective channel length, such that characteristics of the transistor can be improved.

It will be apparent to those skilled in the art that various modifications and variations can be made in the invention without departing from the spirit or scope of the invention. Thus, it is intended that the invention cover the modifications and variations of this invention provided they come within the scope of the appended claims and their equivalents.

What is claimed is:

1. A manufacturing method of a semiconductor device, the method comprising:

forming a layer comprising a plurality of hemispherical single crystal silicon elements over a semiconductor substrate;

forming one or more carbon nano tubes between adjacent hemispherical single crystal silicon elements;

forming a gate insulating layer over the hemispherical single crystal silicon elements, the semiconductor substrate, and the carbon nano tubes; and forming a gate material layer over the gate insulating layer.

2. The manufacturing method of claim 1, wherein forming the layer comprising the plurality of hemispherical single crystal silicon elements comprises:

forming a photoresist pattern, which exposes an active region, over the semiconductor substrate;

forming a layer comprising a plurality of hemispherical polycrystalline silicon elements over the active region;

transforming the hemispherical polycrystalline silicon elements into the hemispherical single crystal silicon elements; and removing the photoresist pattern.

3. The manufacturing method of claim 2, wherein the layer comprising the plurality of hemispherical polycrystalline silicon elements is formed with a material selected from the group consisting of a metastable polysilicon layer, a hemispherical silicon crystalline layer, and combinations thereof.

4. The manufacturing method of claim 2, comprising transforming the layer comprising the plurality of hemispherical polycrystalline silicon elements by performing a thermal process.

5. The manufacturing method of claim 4, wherein the thermal process is selected from the group consisting of a rapid thermal annealing process and a furnace annealing process.

6. The manufacturing method of claim 5, comprising performing the rapid thermal annealing process for a time in range of about one to about thirty minutes.

7. The manufacturing method of claim 4, comprising performing the thermal process at a temperature in a range of about 600° C. to about 1000° C.

8. The manufacturing method of claim 5, comprising performing the furnace annealing process for at time in a range of about twenty minutes to about two hours.

9. The manufacturing method of claim 2, comprising transforming the hemispherical polycrystalline silicon elements into the hemispherical single crystal silicon elements by exposing the hemispherical polycrystalline silicon elements to a plasma.

10. The manufacturing method of claim 2, comprising transforming the hemispherical polycrystalline silicon elements into the hemispherical single crystal silicon elements by performing an ion injection process using an inert gas on the hemispherical polycrystalline silicon elements.

11. The manufacturing method of claim 10, wherein an acceleration energy of the ion injection process ranges from about 1 KeV to about 10 KeV.

12. The manufacturing method of claim 1, wherein forming the one or more carbon nano tubes uses a surface energy difference resulting from the hemispherical shape of the hemispherical single crystal silicon elements.

13. The manufacturing method of claim 1, wherein forming the carbon nano tubes is performed in an atmosphere of a mixed gas of hydrogen and carbon.

14. The manufacturing method of claim 1, wherein a height of the carbon nano tubes ranges from about 10 nm to about 200 nm.

15. The manufacturing method of claim 1, wherein forming the gate insulating layer is performed by an atomic layer deposition method.

16. The manufacturing method of claim 1, wherein the gate insulating layer is formed with a material selected from the group consisting of $Al_2O_3$, $HfO_2$, $ZrO_2$, SiON, $La_2O_3$, $Y_2O_3$, $TiO_2$, $CeO_2$, $N2O_3$, $Ta_2O_5$, $BaTiO_3$, $SrTiO_3$, $(Ba,Sr)TiO_3$ (BST), PbZrTiO (PZT), and combinations thereof.

* * * * *